(12) United States Patent
Niimi et al.

(10) Patent No.: US 9,018,604 B2
(45) Date of Patent: Apr. 28, 2015

(54) ARRANGEMENT FOR THE HANDLING OF A LIQUID METAL FOR COOLING REVOLVING COMPONENTS OF A RADIATION SOURCE BASED ON A RADIATION-EMITTING PLASMA

(71) Applicant: USHIO Denki Kabushiki Kaisha, Tokyo-to (JP)

(72) Inventors: Goto Niimi, Shizuoka-ken (JP); Paulus P. M. Blom, Veldhoven (NL); Wilhelmus V. J. Van Nunspeet, Simpelveld (NL)

(73) Assignee: USHIO Denki Kabushiki Kaisha, Tokyo-To (JP)

( * ) Notice: Subject to any disclaimer, the term of this patent is extended or adjusted under 35 U.S.C. 154(b) by 96 days.

(21) Appl. No.: 14/250,709

(22) Filed: Apr. 11, 2014

(65) Prior Publication Data

US 2014/0307857 A1 Oct. 16, 2014

(30) Foreign Application Priority Data

Apr. 11, 2013 (DE) .......................... 10 2013 103 668

(51) Int. Cl.
*G21K 5/00* (2006.01)
*H05G 2/00* (2006.01)
(52) U.S. Cl.
CPC ....................................... *H05G 2/008* (2013.01)
(58) Field of Classification Search
USPC ................................. 250/493.1, 494.1, 504 R
See application file for complete search history.

(56) References Cited

U.S. PATENT DOCUMENTS

| | | | |
|---|---|---|---|
| 7,427,766 B2 | 9/2008 | Jonkers | |
| 7,476,884 B2 | 1/2009 | Gaebel | |
| 7,531,820 B2 | 5/2009 | Hergenhan | |
| 7,800,086 B2 | 9/2010 | Ziener | |
| 2007/0228298 A1* | 10/2007 | Komori et al. | 250/493.1 |
| 2011/0101251 A1 | 5/2011 | Metzmacher | |
| 2012/0057680 A1 | 3/2012 | Hemberg | |
| 2013/0206863 A1* | 8/2013 | Yabu et al. | 239/102.2 |

FOREIGN PATENT DOCUMENTS

| | | |
|---|---|---|
| DE | 1800959 | 5/1969 |
| DE | 1929025 | 1/1970 |
| DE | 102005023060 A1 | 11/2006 |
| DE | 112005001190 T5 | 4/2007 |
| EP | 1854571 B1 | 11/2007 |
| EP | 2198674 B1 | 6/2010 |

\* cited by examiner

*Primary Examiner* — Nicole Ippolito
(74) *Attorney, Agent, or Firm* — Patentbar International, P.C.

(57) ABSTRACT

An arrangement for handling a liquid metal for cooling revolving components of a radiation source based on a radiation-emitting plasma has the handling arrangement for the liquid metal comprises a reservoir of liquid metal in a vessel, a tempering device for adjusting the temperature moderately above the melting point of the metal, a pump unit for moving the liquid metal in circulation. The handling unit containing the reservoir and the pump unit is provided for transporting the metal into a separated source module via a feed pipe and a return pipe for guiding highly heated metal back from the source module into the reservoir. The return pipe is formed as a straight pipe slightly inclined to the reservoir to guide the heated metal back by action of gravity in a substantially laminar flow.

17 Claims, 6 Drawing Sheets

Cold

Hot

Cold

Hot

US 9,018,604 B2

ARRANGEMENT FOR THE HANDLING OF A LIQUID METAL FOR COOLING REVOLVING COMPONENTS OF A RADIATION SOURCE BASED ON A RADIATION-EMITTING PLASMA

RELATED APPLICATIONS

This application claims priority to German Patent Application No. DE 10 2013 103 668.6, filed Apr. 11, 2013, which is incorporated herein by reference in its entirety.

FIELD OF THE INVENTION

The invention is directed to an arrangement for handling a liquid metal for cooling revolving components of a radiation source based on a radiation-emitting plasma. The invention is preferably applied in radiation sources for photolithographic production of semiconductor chips by means of short-wavelength radiation in the X-ray range, particularly by means of extreme ultraviolet (EUV) radiation.

BACKGROUND OF THE INVENTION

Special cooling systems in which metal in molten form is used as cooling medium are already known for a wide variety of applications such as the cooling of high-performance circuits, nuclear reactors or radiation sources for the X-ray range. Liquid metal has the advantage of very good heat conductivity and moreover has electromagnetic properties so that the pumps that are required for generating a flow of coolant can be small and can be implemented without moving parts and external to the coolant.

US 2012/0057680 A1 discloses a circulation of liquid metal for an x-ray radiation source in which the metal is held at high pressure and provided as an emitter material in droplet form to be impinged upon by an electron beam for plasma generation. However, the metal is not used as coolant here.

In short-wavelength emitting radiation sources, e.g., extreme ultraviolet (EUV) radiation sources, the components used to generate the plasma which are heated to a very high degree by the plasma generation are cooled with a liquid metal.

In the radiation source described in EP 2 198 674 B1, for instance, a rotating disk electrode is supplied with a liquid metal in a cooling circuit and the liquid metal is pumped into a cooling device after electrode contact. However, neither the enormous quantities of heat to be removed nor the temperature gradient to be maintained are sufficiently considered in the compact construction disclosed therein.

Another radiation source of this kind is disclosed in U.S. Pat. No. 7,427,766 B1. The radiation source works on the basis of a discharge plasma which is generated between two electrodes and which emits EUV radiation (in the range of 13.5 nm). In this case, the components which are highly heated during plasma generation are two rotating disk electrodes which are located opposite one another in such a way that a discharge region for the generation of a discharge plasma is formed between the electrodes at the location of the shortest distance between the circumferential faces of the electrodes. During rotation, the electrodes are partially dipped in each instance into a melt bath of liquid tin; the tin performs several functions, of which the most important are the forming of electrical contacts and the cooling of the electrodes. At the same time, however, the tin in U.S. Pat. No. 7,427,766 B1 is also emitter material for the generation of EUV radiation; the tin applied to the electrodes when rotating out of the melt bath is evaporated in the discharge region by means of a laser, and an electric discharge converts the evaporated tin into radiation-emitting plasma. The very high electrical outputs required for generating the discharge plasma are largely converted into waste heat which is absorbed by the electrodes and dissipated by immersion in the melt bath. However, U.S. Pat. No. 7,427,766 B1 does not state how the required cooling of the heated tin bath is to take place.

In this context, DE 10 2005 023 060 A1 discloses an extension of the tin bath by integrating the liquid metal, as a first coolant, into a cooling system. The cooling system has one heat exchanger through which the metal melt (as first coolant) flows outside an electrode housing directly encasing the electrodes in a cooling circulation via a connecting element of channels or pipes in another vessel part, containing a reservoir of the metal. Owing to the electrodes rotating at a high speed, the liquid metal is driven upwards from a lower feed channel of the connecting element at the slit-shaped immersion bath of the electrode housing to an upper return channel of the connecting element and transported through the adjacent reservoir in circulation. Excess metal quantities accumulate at a wiper and produce pressure in result to force the liquid metal through the return channel into the reservoir preferably via a filter or an oxide deposition chamber. Problems of the hot, aggressive metallic liquid after the heating by the electrode are neither mentioned nor considered.

For technical reasons relating to manufacture and for the sake of economy, stainless steel is usually used as material for the cooling vessel system; however, stainless steel is not sufficiently resistant to electrochemical corrosion of a metal melt (e.g., lithium, tin, etc.) and mechanical erosion of a heated metal.

General constructive solutions, how mechanical stress of vessel walls by dynamic metal melts can be reduced, can be found in the documents DE 1 800 959 C, DE 19 29 025 A or EP 1 854 571 B1, for example.

Steps are already known from US 2011/0101251 A1 for containing or preventing corrosion through liquid tin for an EUV radiation source in that structural component parts of an EUV radiation source whose surfaces come into direct contact with liquid tin are protected against corrosion by means of resistant coating. In addition to the extended life of the surfaces as a result of the corrosion-inhibiting coating of the structural component parts, the purity of the tin melt is also conserved for a longer time because it is not contaminated by the waste products of corrosion.

However, while corrosion of the inner vessel surfaces can indeed be suppressed by coating with TiN or other compounds known from US 2011/0101251 A1, this solution still has the disadvantage that, in cooling circuits with circulating metal melts, vessel walls which are inclined or curved in the direction of flow, e.g., pipe elbows, etc., and with which the highly heated metal melt collides mechanically are exposed to severe erosion in spite of the coating. The coating does not provide adequate protection at these locations, so that while the risks of ruptured pipes and contamination of the metal melt may be temporarily forestalled, they occur nonetheless.

SUMMARY OF THE INVENTION

It is the object of the invention to find a possibility for handling a liquid metal for cooling revolving components of a plasma-based radiation source which minimizes the impairment of the properties of the metal which is caused in a cooling circuit of the liquid metal by corrosion, erosion and contamination and minimizes erosion of the surfaces of pipes and vessel walls which are stressed by heat and flow.

A further object of the invention is to prolong the life of the entire cooling system by reducing maintenance.

According to the invention, the above-stated object in an arrangement for handling a liquid metal for cooling a revolving component of a plasma-based radiation source in which a vessel for providing the liquid metal communicates with a source module, in which radiation-emitting plasma is generated, via two pipes for guiding the metal in circulation through the source module, wherein the vessel is partly filled with the metal so that a reservoir of liquid metal is formed to replace metal consumed in the source module, and a tempering unit for the metal is provided for adjusting the temperature of the vessel to a temperature range moderately higher than the melting point of the metal, is met in that a pump unit is provided for moving the liquid metal in circulation to the source module, wherein transport of the metal is provided from a handling unit for the metal, containing the reservoir and the pump unit, via a feed pipe into the separated source module, and a return pipe is provided for guiding highly heated metal from the source module back into the handling unit with the reservoir of liquid metal, wherein the return pipe from the source module to the reservoir is formed as a straight inclined pipe at a gradient relative to the reservoir in order to guide the heated metal into the reservoir by the action of gravity in substantially laminar flow.

The return pipe preferably extends into the vessel with the reservoir to the extent that the metal heated in the source module is conducted into the reservoir without flow forces impinging on a wall of the vessel. Three embodiment variants are suitable for this purpose.

In a particularly simple and preferred variant, the return pipe is arranged so as to dip directly into the reservoir.

In a second variant the return pipe has a pipe end above the liquid surface of the reservoir, wherein a deflecting element which is highly resistant to erosion and corrosion and which is arranged downstream of the pipe end is provided for conducting the heated metal into the reservoir.

In a third variant, a catching element which is highly resistant to erosion and corrosion is positioned opposite the deflecting element in direction of gravitational force, wherein the catching element is arranged so as to dip in at a shallow angle to the surface of the reservoir.

For this purpose, an inner coating with high resistance to erosion and corrosion is provided at least inside the return pipe.

For facilitating maintenance, a pipe connection is provided at least in the return pipe between the source module and the vessel for handling the liquid metal to allow pipe parts to be exchanged In a further preferred configuration, a separate inner pipe with high resistance to erosion and corrosion is arranged at least in an end region of the return pipe, wherein the inner pipe is easily exchangeable because of the pipe connection.

The pipe connection preferably in the form of a ring overlapping the pipe parts is formed of a resistant material with a lower thermal expansion coefficient than the pipe parts. The overlapping ring is advantageously produced from a metal or an alloy from the group of elements including titanium, vanadium, chromium, zirconium, niobium, molybdenum, hafnium, tantalum, tungsten, rhenium, ruthenium, osmium and iridium with a lower thermal expansion coefficient than the pipe parts.

For this purpose, the pipe connection is constructed in the form of a T-profile ring overlapping the pipe parts.

In case an inner pipe is used, the pipe connection can be formed directly integral with the inner pipe as an overlapping ring of resistant material with a lower thermal expansion coefficient than the pipe parts.

The vessel for receiving the reservoir is preferably shaped as a cylinder of low height and is horizontally arranged, wherein the cylinder has an interior space that is filled to less than 80% with the reservoir of liquid metal.

It is furthermore advantageous that the vessel is pierced by return pipe and feed pipe above the reservoir of liquid metal in a lateral surface of the cylinder.

For this purpose, the vessel has a removable cover which forms a cover surface of the cylinder.

In a further configuration of the invention, a slag separator is provided in the vessel, which slag separator is formed in a plate-shaped manner and is provided with a quantity of perforations in order to prevent a slag of contaminated or oxidized metal in an upper region of the reservoir from reaching a connection location of the connection pipe of the pump unit.

At least one element or an alloy involving an element from the group including lithium, gallium, tin, gadolinium and terbium is advantageously used as liquid metal.

The invention is premised on the basic consideration that special provisions must be made in a cooling system in which the coolant is a metal and is partially consumed in the cooling circuit in the region of the radiation source in order to additionally take into account the corrosive and erosive properties of the metal coolant. A first step is the formation of a reservoir for the metal coolant to compensate for the slight, but not insignificant, consumption of metal. The highly heated metal returning from the source module of the radiation source flows directly into this reservoir to achieve an immediate cooling through mixing in the reservoir. In a second step, the hot metal is to be introduced into the reservoir, in a laminar flow as far as possible, by the action of gravity in a pipe which is inclined slightly toward the reservoir in order to minimize erosion at pipe walls and vessel walls. To this end, the return pipe preferably extends in a straight line, has a shallow entry angle to the surface of the reservoir and is provided with speed-reducing means which prevent the hot metal from directly impinging on or splattering on walls of the vessel.

Although the metal is guided through the source module under vacuum, heating caused by the electric discharge and accompanying processes (e.g., plasma formation, heat development, sputtering, etc.) is notably associated with chemical activation, oxidation and contamination of the metal coolant. The resulting impurities in the metal collect on the surface of the reservoir of the liquid metal as a kind of slag and can thus be excluded from the further circulation of the metal by a third step in that the liquid metal for circulation is sucked from a lower portion of the reservoir by a pump unit and is pumped to the feed pipe of the source module. In the course of circulation, the metal runs through a tempering unit which on the one hand ensures that the circulation is always kept above the melting temperature of the liquid metal when the source module is operation-ready and, on the other hand, extracts heat from the metal coolant particularly intensively when the latter is highly heated by the pulsed discharges (which are typically in range between 3 and 20 kHz) and the cooling power thereof is drastically reduced when the source module is in a passive phase (e.g., idle times between exposures).

The arrangement according to the invention makes it possible to handle a liquid metal for cooling revolving components of a plasma-based radiation source while minimizing the impairment of the properties of the metal that is caused by corrosion, erosion and contamination in a cooling circuit of the liquid metal and while minimizing the erosion of the surfaces of pipes and vessel walls which are exposed to heat and flow. Further, reduced expenditure on maintenance leads to an appreciable extension of the lifetime of the entire cooling system.

BRIEF DESCRIPTION OF THE DRAWINGS

The invention will be described more fully in the following with reference to embodiment examples. The accompanying drawings show.

DETAILED DESCRIPTION OF THE PREFERRED EMBODIMENTS

Figure 1:
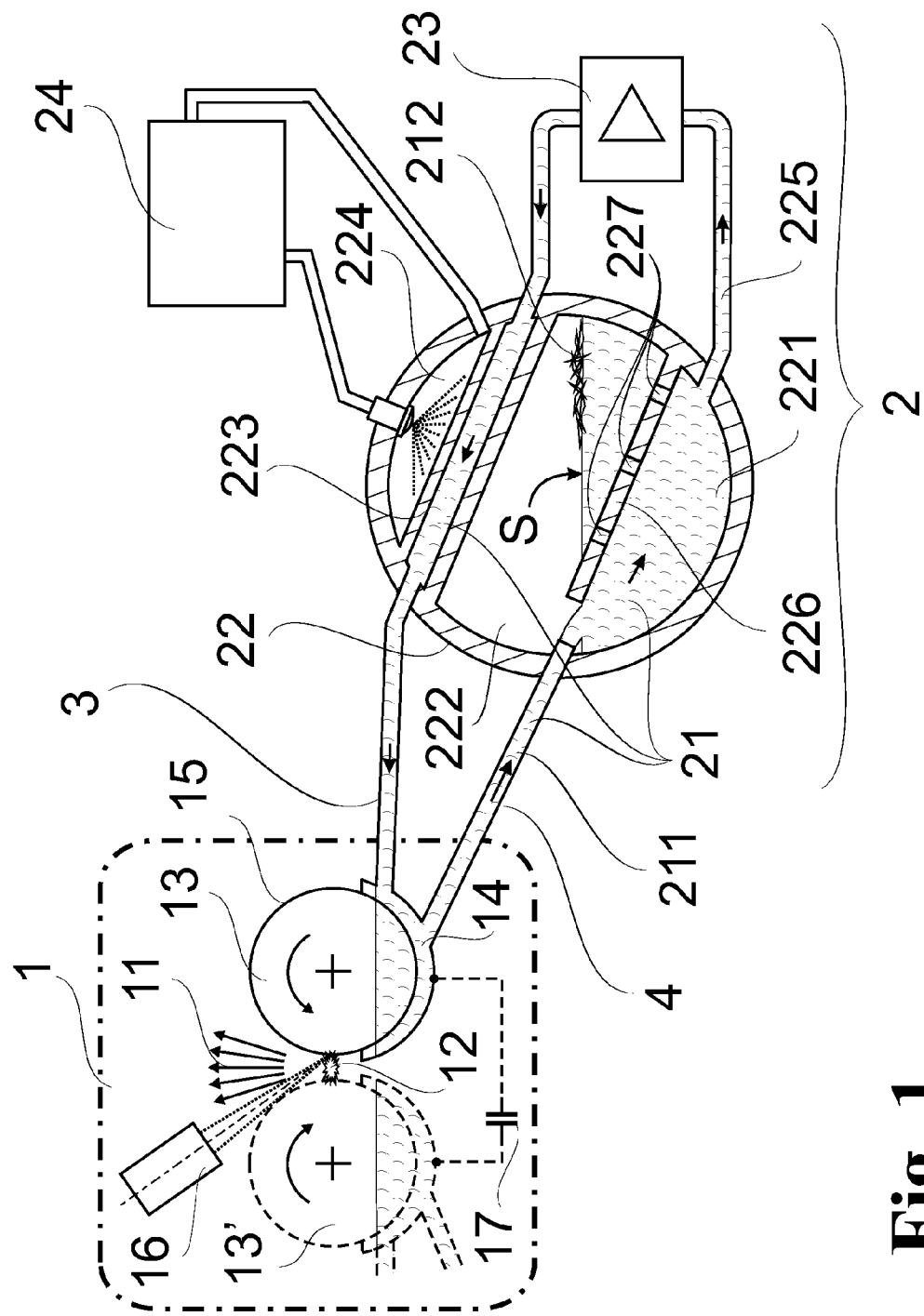
FIG. 1 a schematic diagram illustrating an arrangement for handling a liquid metal for cooling rotating components in a plasma-based radiation source.

As regards its basic construction, the arrangement according to FIG. 1 includes a cooling circuit in which a source module 1 communicates with a handling unit 2 via a feed pipe 3 and a return pipe 4. The source module 1 for generating a plasma emitting a short-wavelength radiation 11 has at least one revolving component 13 which dips into a bath of liquid metal 21, this metal 21 serving primarily as coolant. Without limiting generality, the metal 21 can also be selected additionally as emitter material for the radiation 11 to be emitted so that the coating 15 which is applied as a result of the rotational movement of the revolving component 13 through the melt bath 14 of the metal 21 constantly provides fresh emitter material which is ionized at a defined position by means of a focused beam of a laser 16 (or other energy beam). Two variants are possible in this respect. On the one hand, this ionization can be converted directly into the radiation 11 emitting plasma 12 by means of the laser 16 (Laser Produced Plasma—LPP). On the other hand, as is shown by the schematic diagram in FIG. 1 which is completed by elements shown as dashed lines, the revolving component 13 can have an opposing companion element 13', a pulsed high voltage source 17 generating an electrical discharge therebetween. In this case, the evaporated emitter material is converted into the hot plasma 12 emitting the radiation 11 by means of the discharge current only after a spot on the coating 15 is evaporated by the laser 16.

The handling unit 2 includes a vessel 22 with a reservoir 221 of liquid metal 21, a pump unit 23 and a tempering device 24. Chiefly the following problems are to be solved in this handling unit 2: First, it must be ensured that there is always sufficient liquid metal 21 for charging the bath 14 in the source module 1, and second, that the quality of this liquid metal 21 is adequate (pure metal or alloy without any oxidation products or contaminants). Third, the hot liquid metal 21 must also have sufficient heat insulation with respect to the surroundings. Neither of these is ensured in the plasma generation process in the source module 1 because the circuit in the source module 1 is not hermetically closed and metal 21 is constantly being consumed therein. This is taken into account by maintaining a sufficiently large reservoir 221 of liquid metal 21 which fills a supply volume 222 in the vessel 22 to at most 80% and can offset the consumption of metal 21 over a defined time period, and oxides and impurities (hereinafter referred to as slag 212) can be skimmed from the surface thereof so that the purity of the metal 21 remains intact. For this purpose, the lowest point in the vessel 22 is chosen for removing the metal 21 from the reservoir 221, a connection pipe 225 being arranged at the lowest point of the vessel 22 to move the liquid metal 21 in direction of the feed pipe 3 via a pump unit 23. Finally, the vessel 22 is placed in the vacuum to thermally insulate the hot liquid metal 21 with respect to the surroundings.

In addition, a slag separator 226 can be provided inside the reservoir 221, this slag separator 226 being arranged above the connection pipe 225 at an inclination to the pump unit 23 as an intermediate wall with holes 227. This prevents the metal 21 from undesirably mixing in the reservoir 221 with the upper region of the slag 212 that has already been separated.

Metals or alloys from the group including lithium (Li), tin (Sb), gadolinium (Gd), terbium (Tb) and gallium (Ga) can be used as suitable coolants (liquid metal 21) in the circuit for cooling the source module 1. EUV emitters suitable for this purpose (like Li, Sn, Gd, Tb) are usually selected, although they need not necessarily be applied in case the emitter material is injected separately into the source module 1 (as is known, for example, from U.S. Pat. No. 7,476,884 B2, U.S. Pat. No. 7,531,820 B2 or U.S. Pat. No. 7,800,086 B2).

The pump unit 23 conveys the liquid metal 21 from the reservoir 221 via the connection pipe 225 into a through-channel 223 which traverses the vessel 22 above the reservoir 221 in a hermetically closed manner until the feed pipe 3 for the source module 1. On the way through the vessel 22, the through-channel 223 is preferably widened so as to realize a large surface for efficient cooling (e.g., spray cooling or heat pipe). To this end, a cooling volume 224 in the vessel 22 is partitioned off hermetically from the supply volume 222 of the reservoir 221 and is incorporated in a circulation of the tempering unit 24.

Figure 2:
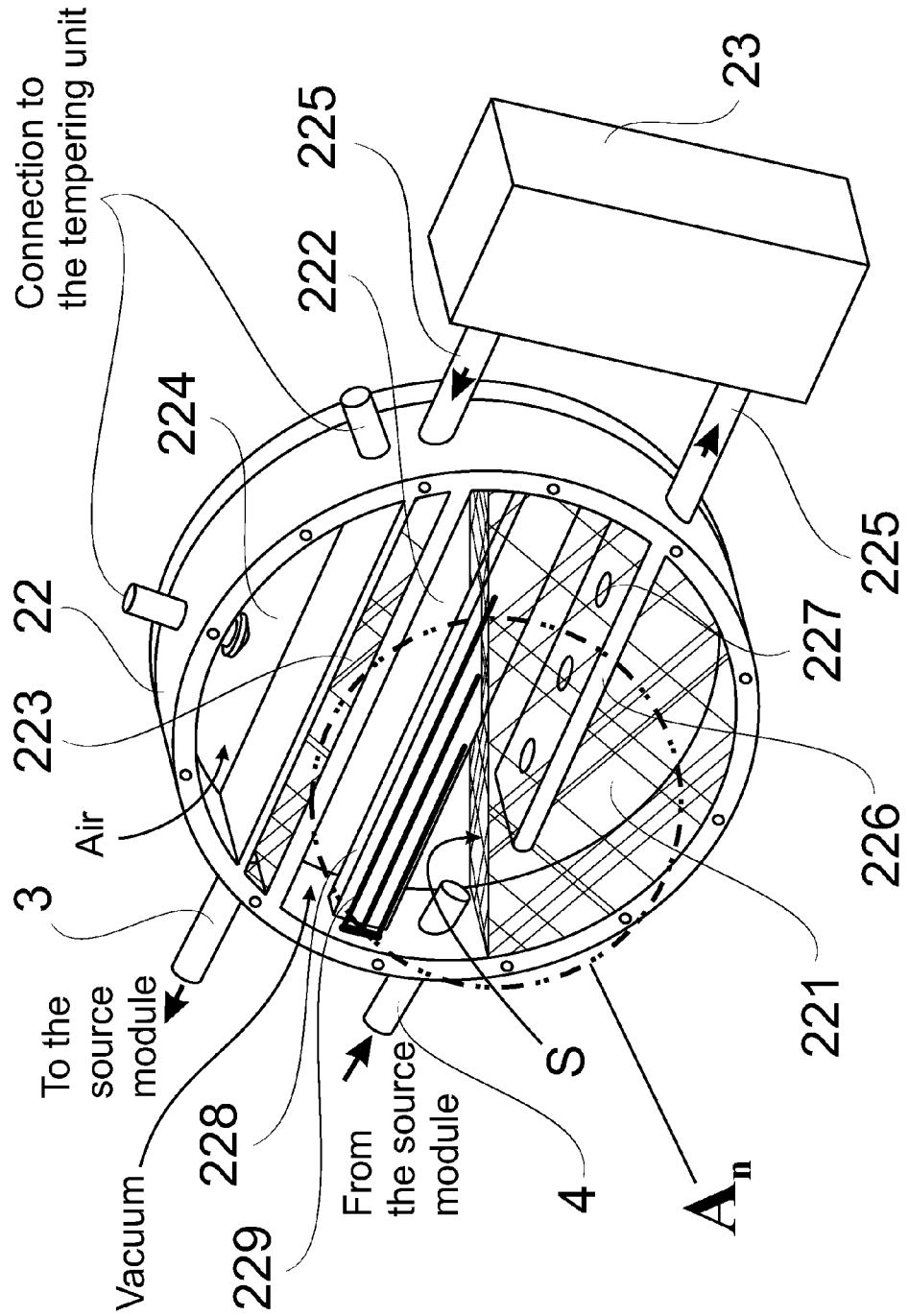
FIG. 2 an exemplary configuration of the arrangement according to the invention with a pumped circulation between source module (heat source), a supply volume and a cooling volume (heat sink) of the handling unit, wherein the section encircled by a dash-dot line shows an inlet region of the return pipe coming from the source module, embodiments thereof being shown in more detail in FIGS. 3a to 3c, below.

FIG. 2 shows a side view of the vessel 22 of the handling unit 2. In this example, the housing 22 has the shape of a horizontally arranged cylinder of small height in which a base surface is formed as a removable housing cover (not shown) that has been omitted in FIG. 2 to allow a view into the interior of the housing 22. The housing 22 has in its interior at least two chambers which are hermetically separated from one another, namely, a supply volume 222 for the reservoir 221 of liquid metal 21 and a cooling volume 224. A through-channel 223 for the liquid metal 21, which through-channel 223 must be thermally adjusted to a desired temperature level via the cooling volume 224 and which leads from the pump unit 23 into the feed pipe 3 to the source module 1, can be embedded in the cooling volume 224 so that it is surrounded on all sides by the cooling volume 224, or it is arranged as a separate chamber between supply volume 222 and cooling volume 224 as is shown in the construction according to FIG. 2.

In the source module 1, the liquid metal 21 is intensively heated by the plasma generation in that the revolving component 13 transmits the heat dissipated from the plasma 12 into the melt bath 14 and, owing to its rotational movement, accelerates a hot metal flow 211 into the return pipe 4. The hot metal flow 211 is automatically guided into the reservoir 221 through the return pipe 4 owing to the force of gravity, the return pipe 4 being installed in the vessel 22 so as to be inclined relative to the surface S of the reservoir 221 so that the hot metal flow 211 can be transported with minimal corrosion and erosion. The return pipe 4 is preferably constructed so as to extend in a completely straight manner, i.e., it has no curved pipe portions.

An immediate cooling of the hot metal flow 211 from the return pipe 4 takes place in the supply volume 222 of the vessel 22 by mixing with the reservoir 221. Further, besides maintaining the reservoir for replacing metal 21 consumed in the source module 1 which was mentioned above, the supply volume 222 serves to separate contaminated or oxidized metal which is brought about due to the "open" circulation of the liquid metal 21 during plasma generation in the source module 1 and which is referred to as slag 212 for the sake of simplicity. To this end, there is provided in the supply volume 222 a slag separator 226 with holes 227 which is formed as an intermediate wall that is inclined in the same direction relative to the return pipe 4. The slag separator 226 creates a barrier between the surface S of the reservoir 221 at which the slag 212 collects and the connection pipe 225 that is fitted in the lower portion of the supply volume 222 and by which the metal 21 is removed from the reservoir 221 by the pump unit 23 and is returned again to the source module 1 via the through-channel 223 and feed pipe 3.

An inclination in the same direction as the return pipe 4 is selected for the feed pipe 3 to the source module 1 and for the through-channel 223 connected with the latter so that the inclination of the connection pipe 225 upstream and downstream of the pump unit 23 is also adapted thereto. The pump unit 23 contains pumping means without moving parts and generates the flow of metal 21 in the connection pipe 225 exclusively by field effects from the outside.

It is of prime importance that a sufficient cooling of the metal 21 be provided in the through-channel 223 when plasma 12 is generated in the source module 1 and the thermal energy that is consequently transmitted into the melt bath 14 by the revolving component 13 is introduced into the reservoir 221 through the hot metal flow 211 flowing back into the vessel 22.

After the immediate cooling through mixing in the reservoir 221 in the supply volume 222, the metal 21 is moved by means of the pump unit 23 through the connection pipe 225 into the through-channel 223 and is adjusted therein to a temperature level moderately (1 to 50 K) higher than the melting temperature of the metal 21 being used.

In so doing, the tempering unit 24 must manage a cooling circuit in such a way that the cooling operates particularly efficiently when a continuous operation is realized by the plasma generation which, although pulsed, takes place in a quasi-continuous manner, so that the metal 21 is substantially heated. The spray cooling illustrated schematically in FIG. 1 is particularly suitable for this purpose. However, steps can also be taken to implement a heat pipe principle between the cooling volume 224 and the tempering unit 24.

Otherwise, when plasma generation is interrupted the tempering unit 24 must incorporate provisions for minimizing the cooling power and, if necessary, a heating of the coolant used in the tempering unit 24 is provided so that the coolant heats the metal 21 above the melting temperature thereof.

In addition, as is shown in FIG. 2, a supporting strut 228 can be provided which dips into the reservoir 221 in an inclined manner and which is arranged in the vessel 22 at the same inclination as the rest of the elements such as through-channel 223, feed pipe 3, connection pipe 225, slag separator 226, and return pipe 4. In this case, the strut 228 can be used at the same time as a fastening base for fill level sensors 229 which terminate, for example, as contact sensors, at different heights for detecting the current level of the surface S of the reservoir 221, and refilling of the reservoir 221 can be triggered if the level of the surface S does no longer touch the last fill level sensor 229.

The region $A_n$ encircled by a dash-dot line in FIG. 2 is shown again in the following FIGS. 3a to 3c in an enlarged view for a more detailed illustration of further steps for mitigating corrosion and erosion occurring at the return pipe 4 and supply volume 222 of the vessel 22 due to the fast, hot metal flow 211.

Figure 3A:
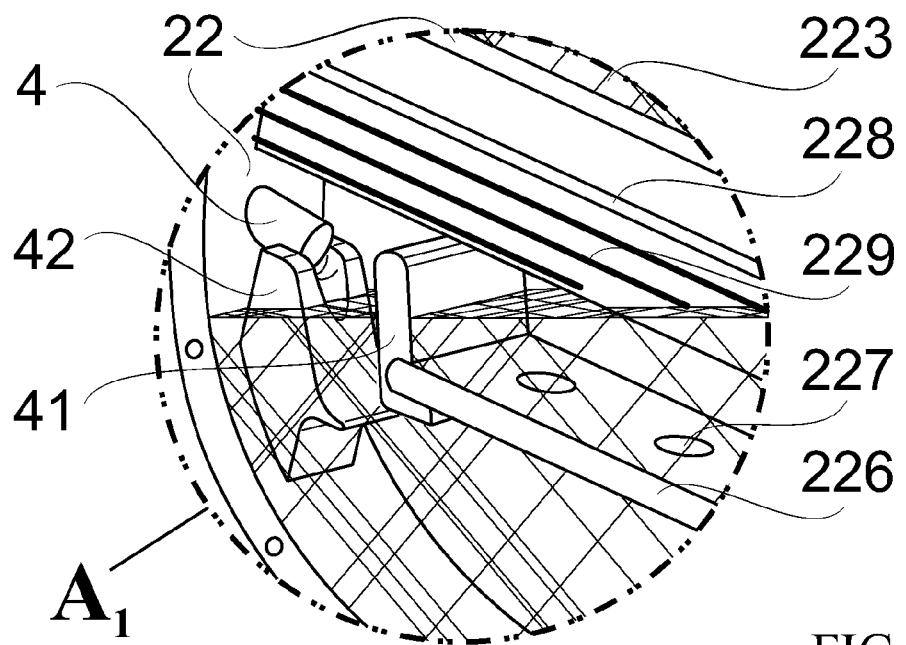
FIG. 3a an erosion-mitigating embodiment of the inlet region of the return pipe in the handling unit in which are provided a deflecting element (baffle) located opposite the pipe end and a catching element which is inclined under the pipe end so as to dip into the surface of the reservoir, both the deflecting element and catching element being made of corrosion-resistant and erosion-resistant material.

FIG. 3a shows a configuration $A_1$ of the inlet region of the return pipe 4 in which a deflecting element 41 of resistant material exhibiting chemical and mechanical resistance to the hot metal flow 211 is arranged opposite the outlet opening of the return pipe 4. The deflecting element 41 can be made of different resistant metals, like niobium, molybdenum, tantalum, tungsten, rhenium, titanium, vanadium, chromium, zirconium, hafnium, ruthenium, osmium or iridium, or of TZM (an alloy of titanium, zirconium and molybdenum), carbon, silicon dioxide, silicon carbide, silicon nitride, aluminium oxide or similar materials. The deflecting element 41 is preferably shaped as a planar baffle and has an angle relative to the flow direction of the return pipe 4 such that the hot metal flow 211 is deflected into the reservoir 221. Because of the inclination of the return pipe 4, the deflecting element 41 can be virtually perpendicular to the surface S of the reservoir 221. In this case, the slag separator 226 is provided for fastening the deflecting element 41. However, the deflecting element 41 could also be fastened to the strut 228 situated above.

After the hot metal flow 211 hits the deflecting element 41 and is deflected by it, a catching element 42 for protecting against erosion of the cylindrical outer wall of the vessel 22 is arranged in such a way below the return pipe 4 that the metal flow 211 which has been deflected and already slowed down is guided approximately parallel to the cylindrical outer wall of the vessel 22 deep into the reservoir 221, where it is cooled by mixing with the metal 21 in the reservoir 221.

Figure 3B:
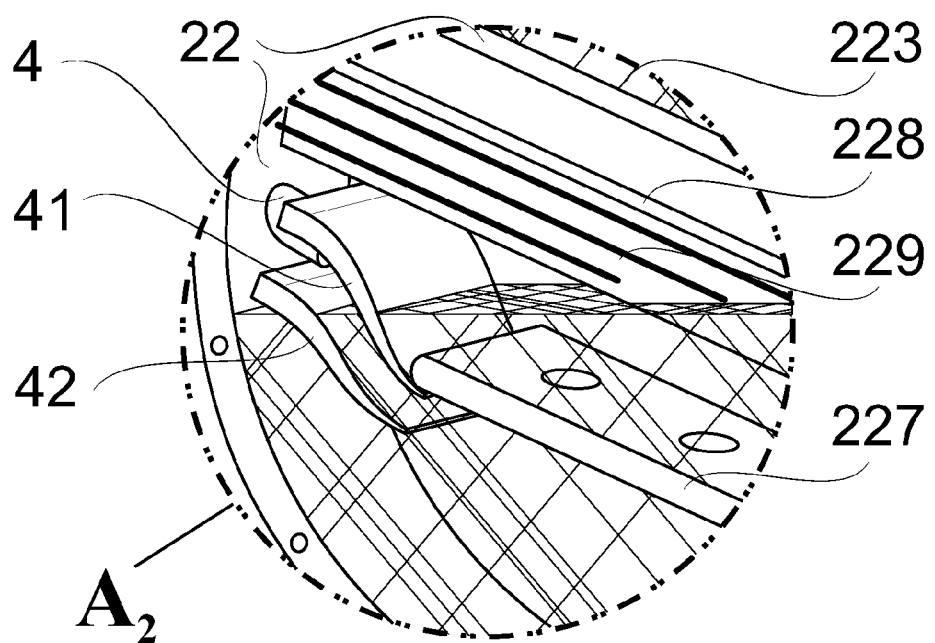
FIG. 3b an alternative construction to FIG. 3a of the outlet region of the return pipe having deflecting element and catching element which are arranged one above the other, are shaped in the same sense and penetrate below the surface of the reservoir at a shallow angle of inclination.

FIG. 3b shows a variant $A_2$ of the inlet region of the return pipe 4 that is modified from FIG. 3a. In this case, the deflecting element 41 has a curved guiding surface adapted to the inclination of the return pipe 4 and lies substantially parallely opposite to the identically shaped catching element 42. Both deflecting element 41 and catching element 42, which are produced from resistant material as was described above, guide the hot metal flow 211 from above the surface S of the reservoir 221 below the slag separator 226 which can also be used in this case for fastening the deflecting element 41. However, the deflecting element 41, like the catching element 42, can also be fastened directly to the vessel 22 at the inlet region of the return pipe 4 or at the heating element 228.

Figure 3C:
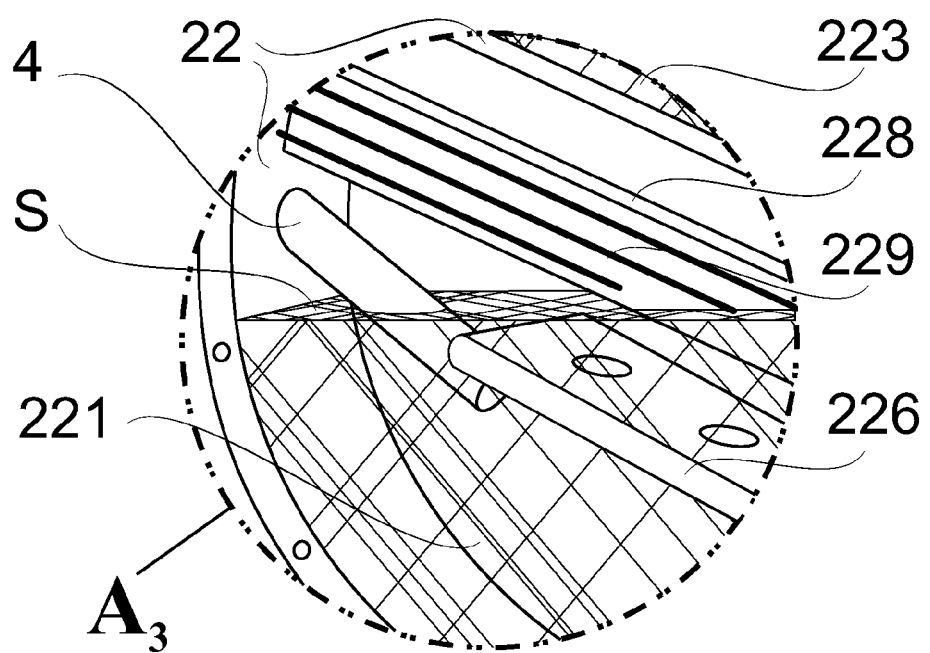
FIG. 3c another alternative embodiment to FIGS. 3a and 3b of the outlet region of the return pipe in which the pipe end is lengthened until the outlet region thereof lies completely below the reservoir surface.

FIG. 3c shows another preferred configuration of the inlet region of the return pipe 4 in which the return pipe 4 itself, coming from the source module 1, introduces the hot metal flow 211 into the supply volume 222 below the surface S of the reservoir 221. The return pipe 4 is lengthened to the extent that it dips directly into the reservoir 221—possibly at a steeper inclination relative to the surface S of the reservoir 221—so that the outlet opening of the return pipe 4 (at any permissible fill level of the supply volume 222) lies below the surface S of the reservoir 221 and can preferably let the hot metal flow 211 stream in below the slag separator 226. In this case, resistant deflecting elements 41 and catching elements 42 can be omitted.

An appreciable increase in the life of the handling unit 2 can be achieved with the three embodiments described above, since the lifetime of the return pipe 4 which is highly stressed by the hot metal flow 211 can be substantially prolonged and, additionally, there is also decreased erosion of the walls of the vessel 22.

Figure 4A:
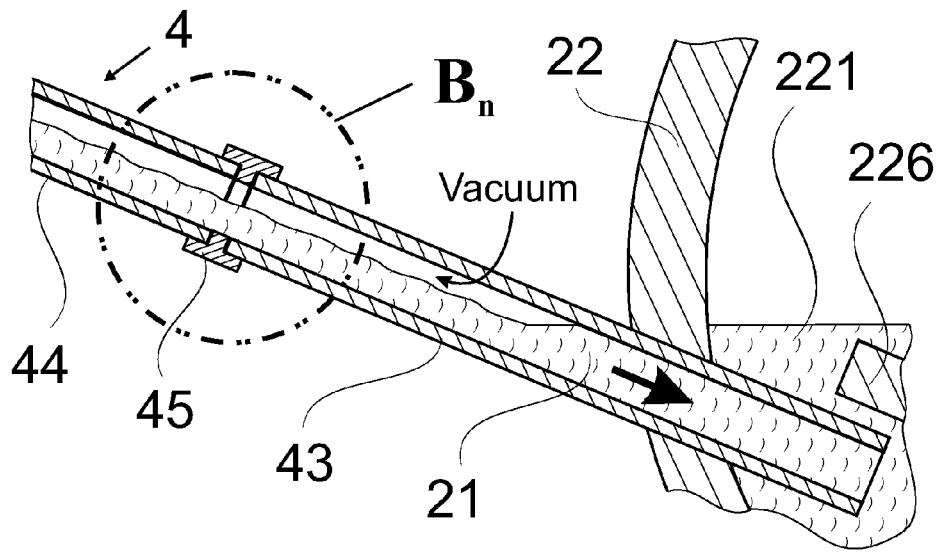
FIG. 4a another configuration of the outlet region of the return pipe in a sectional view of the return pipe with exchangeable outlet region using a pipe connection in the form of an overlapping ring.

Further improvements in the resistance of the handling unit 2 to erosion can be made particularly (but not exclusively) for the latter variant by dividing the very highly stressed return pipe 4 into exchangeable pipe parts 43 and 44 as is shown in FIG. 4a. In so doing, the return pipe 4 is divided into pipe parts 43 and 44; pipe part 44 communicates with the source module 1, and pipe part 43 is interchangeable as end region and outlet region of the return pipe 4. Pipe parts 43 and 44 are connected to one another through an overlapping ring 45 which is fashioned from a material having a lower thermal expansion coefficient than pipe parts 43 and 44. Owing to this property of the ring 45, it is ensured that the pipe parts 43 and 44 are pressed from inside against the overlapping ring 45 in the hot operating condition (i.e., when the metal 21 is above its melting point in liquid aggregate state) and can be taken apart in a simple manner in the cold condition. FIGS. 4b and 4c again show the connection area $B_n$, circled in FIG. 4a, of the pipe parts 43 and 44 in enlarged sectional views $B_1$ and $B_2$, respectively, in the cold condition (FIG. 4b) on the one hand and in the hot operating condition (FIG. 4c) on the other hand.

Figure 4B:
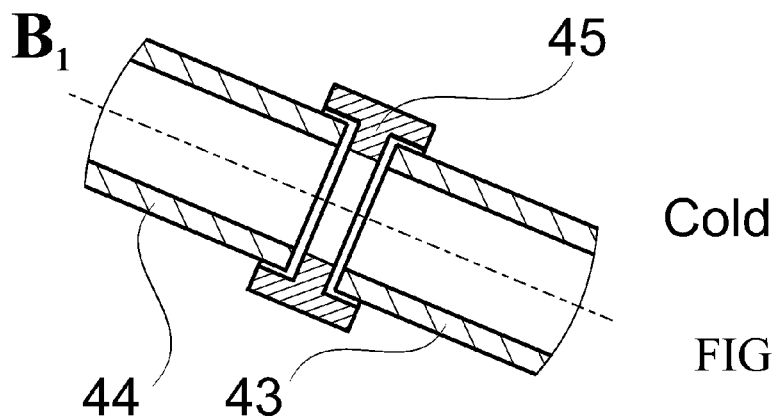
FIG. 4b an enlarged section of the pipe connection with overlapping T-profile ring in cold condition (e.g., room temperature)

As can be seen in FIG. 4b, the overlapping ring 45 is preferably constructed as a T-profile and leaves open a defined gap relative to pipe parts 43 and 44 which allows for the thermal expansion of the pipe parts 43 and 44 and which happens to be larger in longitudinal direction than in radial direction. Thus in FIG. 4c, in the hot operating condition, a (smaller) gap is still left if necessary for a further longitudinal expansion of the pipe parts 43 and 44, but the radial gaps are tightly closed at the overlapping sealing surfaces 46 of the ring 45 and therefore form a reliably tight connection of the pipe parts 43 and 44 for the liquid metal 21 by means of the overlapping ring 45.

Apart from the thermal expansion coefficient, the material for the overlapping ring 45 is also selected with a view to high resistance to corrosion and erosion from the liquid metal 21. Metals which are particularly suitable for the overlapping ring 45 are those in the subgroups of periods 4, 5 and 6 of the periodic table, particularly titanium, vanadium, chromium, zirconium, niobium, molybdenum, hafnium, tantalum, tungsten, rhenium, ruthenium, osmium and iridium as well as an alloy of titanium, zirconium and molybdenum (TZM).

Figure 5A:
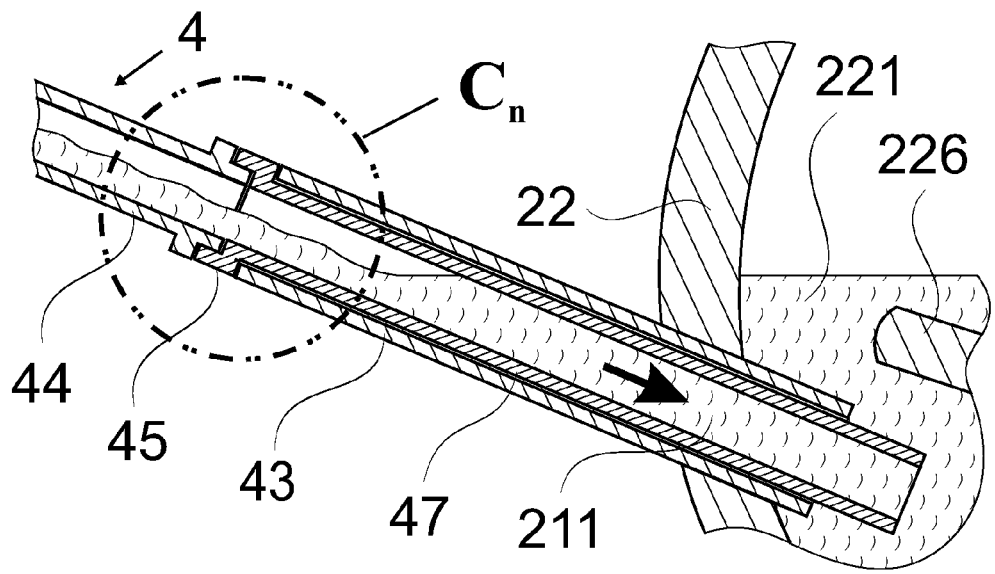
FIG. 5a an embodiment of the pipe connection in a sectional view of the return pipe with exchangeable inner pipe, an overlapping ring profile being formed directly integral therewith.

FIG. 5a shows an alternative variant to FIG. 4a for facilitating maintenance of the erosion-prone return pipe 4. In this case, the end region of the return pipe 4 is formed as an outer pipe part 43 having a larger diameter in which an inner pipe 47 is inserted. This inner pipe 47 is formed as an exchangeable straight pipe with an integrally formed overlapping ring 45 in direction of pipe part 44. Therefore, it is fabricated from a resistant material having a lower thermal expansion coefficient than pipe parts 43 and 44. In this embodiment example, the outer pipe part 43 is fixedly connected (e.g., welded or soldered) to the vessel 22.

Figure 4C:
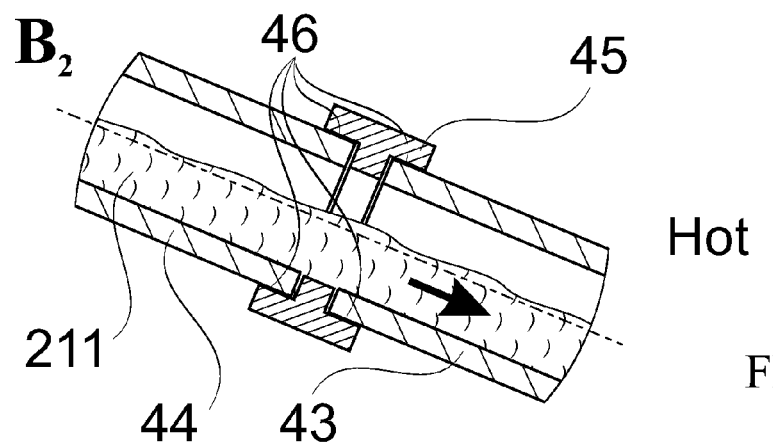
FIG. 4c an enlarged section of the pipe connection with overlapping ring in heated operating condition (above the melting temperature of the liquid metal)

Analogous to FIGS. 4a to 4c, the circled connection region $C_n$ in FIG. 5a is shown in enlarged sectional views $C_1$ and $C_2$, respectively, for the cold condition (FIG. 5b) on the one hand and for the hot operating condition (FIG. 5c) on the other hand.

Figure 5B:
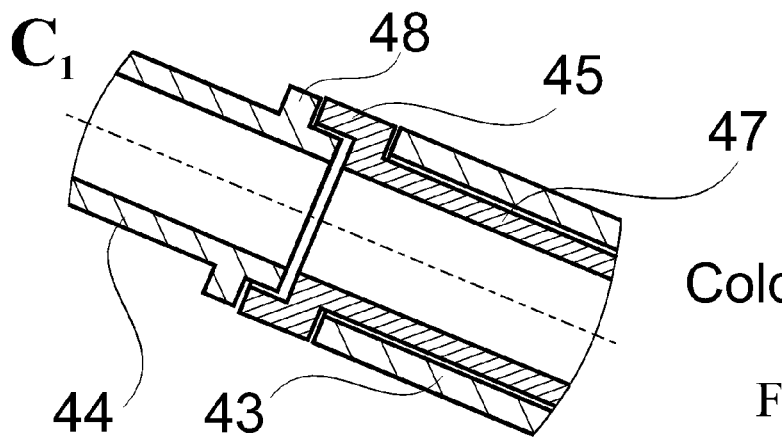
FIG. 5b an enlarged section of the pipe connection with inner pipe in cold condition (e.g., with solidified metallic coolant)

As can be seen from FIG. 5b, the pipe part 44 coming from the source module 1 in this example has a pipe collar 48 to allow a pushing force to be exerted against the integrally formed ring 45 and the outer pipe part 43 when inserting the inner pipe 47 so that there is an outer, rough (not vacuum-tight and not necessarily sealing with respect to the liquid metal 21) longitudinal contact surface between the pipe parts 43 and 44 and the integrally formed ring 45 of the inner pipe 47.

Figure 5C:
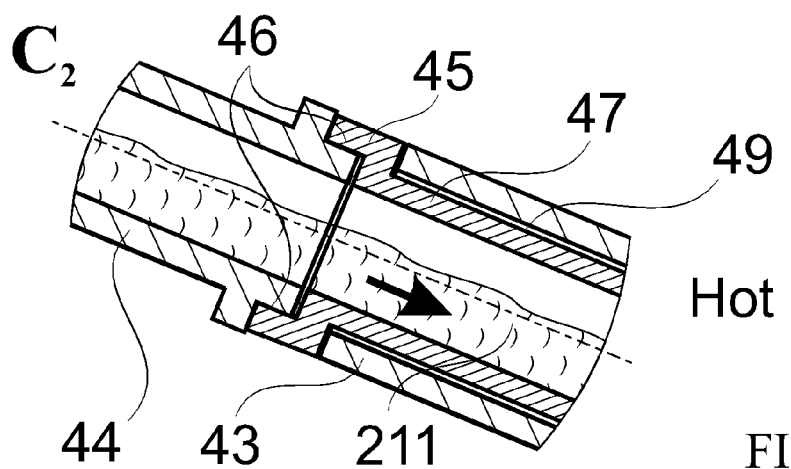
FIG. 5c an enlarged section of the pipe connection with inner pipe in the heated operating condition (above the melting temperature of the metallic coolant).

As is shown in FIG. 5c for the hot operating condition, the actually reliable seal for the hot metal flow 211 is ensured by the radial contact pressing of the sealing surfaces 46 of the overlapping ring 45. In this case, a radial sealing between the inner pipe 47 and the outer pipe part 44 is not brought about, but is also not necessary in view of the inclination of the entire return pipe 4 because gravity prevents the liquid metal 21 from rising through the hollow-cylindrical intermediate space 49. Further, there is also no capillary action in the intermediate space 49 because the surfaces of the inner pipe 47 and outer pipe part 43 are non-wetting to the liquid metal 21, and the intermediate space 49 is additionally enlarged in hot condition. The inner pipe 47 with the overlapping ring 45 formed integral therewith—as was described in the preceding embodiment example for the overlapping ring 45 only—is fabricated from one of the above-indicated materials having a sufficiently low thermal expansion and a sufficient resistance to corrosion and erosion caused by the hot liquid metal 21.

Apart from facilitating assembly and disassembly of the source module 1 and handling unit 2, the steps described with reference to FIGS. 4a-4c and FIGS. 5a-5c are also directed above all to prolonging the lifetime of the handling unit 2 through facilitated exchange of wear components.

LIST OF REFERENCE NUMERALS 1 source module
11 radiation
12 plasma
13 revolving component
14 melt bath
15 coating (on the revolving component)
16 laser
17 pulsed high voltage source 2 handling unit (for liquid metal)
21 (liquid) metal
211 (hot) metal flow
212 slag
22 vessel
221 reservoir
222 supply volume
223 through-channel
224 cooling volume
225 connection pipe
226 slag separator
227 holes
228 strut
229 fill level sensor
23 pump unit
24 tempering unit
3 feed pipe (to the source module)
4 return pipe (from the source module)
41 deflecting element (baffle)
42 catching element
43 pipe part, outer pipe
44 pipe part
45 (overlapping) ring
46 sealing surface
47 inner pipe
48 pipe collar
49 intermediate space
S surface (of the metal of the reservoir)

What is claimed is:

1. An arrangement for handling a liquid metal for cooling a revolving component of a plasma-based radiation source, the arrangement comprising:
a source module for generating radiation-emitting plasma;
a vessel for supplying the liquid metal to the source module via a feed pipe and a return pipe for guiding the liquid metal in circulation through the source module, wherein the vessel is partly filled with the metal
a tempering unit for adjusting the temperature of the liquid metal in the vessel to a temperature higher than the melting point of the metal;
a handling unit comprising a reservoir of the liquid metal in the vessel and a pump unit;
the pump unit for circulating the liquid metal from the handling unit into the source module, via the feed pipe, and from the source module via the return pipe back into the handling unit with the reservoir;
wherein the return pipe is formed as a straight inclined pipe at a gradient relative to the reservoir to guide the heated metal into the reservoir in a substantially laminar flow.

2. The arrangement according to claim 1, wherein the return pipe extends into the vessel in such a way that the metal heated in the source module is conducted into the reservoir without flow forces impinging on a wall of the vessel.

3. The arrangement according to claim 2, wherein the return pipe dips directly into the reservoir.

4. The arrangement according to claim 2, wherein the return pipe comprises a pipe end above a surface (S) formed by the metal in the reservoir, the pipe end comprising a deflecting element downstream of the pipe end for conducting the heated liquid metal into the reservoir, the deflecting element being highly resistant to erosion and corrosion.

5. The arrangement according to claim 4, wherein a catching element highly resistant to erosion and corrosion is positioned opposite the deflecting element in a direction of gravitational force, the catching element forming a shallow angle with the surface (S) of the reservoir when the catching element is partially submerged into the reservoir.

6. The arrangement according to claim 1, wherein the return pipe comprises an inner coating with high resistance to erosion and corrosion at least inside the return pipe.

7. The arrangement according to claim 1, further comprising a pipe connection at least in the return pipe between the source module and the vessel.

8. The arrangement according to claim 7, further comprising a separate inner pipe with high resistance to erosion and corrosion at least in an end region of the return pipe, wherein the inner pipe is exchangeable.

9. The arrangement according to claim 7, wherein the pipe connection is in the form of a ring overlapping pipe parts, the pipe connection being formed of a resistant material with a lower thermal expansion coefficient than that of the pipe parts.

10. The arrangement according to claim 9, wherein the overlapping ring is produced from a metal or an alloy from the group of elements consisting of titanium, vanadium, chromium, zirconium, niobium, molybdenum, hafnium, tantalum, tungsten, rhenium, ruthenium, osmium iridium, and combinations thereof with a lower thermal expansion coefficient than that of the pipe parts.

11. The arrangement according to claim 9, wherein the pipe connection is in the form of a T-profile ring overlapping the pipe parts.

12. The arrangement according to claim 8, wherein the pipe connection is integral with the inner pipe as an overlapping ring of resistant material with a lower thermal expansion coefficient than that of the pipe parts.

13. The arrangement according to claim 1, wherein the vessel is shaped as a cylinder of and is horizontally arranged, wherein the cylinder comprises a supply volume that is filled to less than 80% with the reservoir of the liquid metal.

14. The arrangement according to claim 13, wherein the vessel is pierced by the return pipe and the feed pipe above the reservoir of the liquid metal in a lateral surface of the cylinder.

15. The arrangement according to claim 13, wherein the vessel comprises a removable cover forming a cover surface of the cylinder.

16. The arrangement according to claim 13, further comprising a slag separator in the vessel, the slag separator being formed in a plate-shaped manner and comprising a plurality of perforations.

17. The arrangement according to claim 1, wherein at least one element or an alloy involving an element from the group consisting of lithium, gallium, tin, gadolinium and terbium is used as the liquid metal.

* * * * *

UNITED STATES PATENT AND TRADEMARK OFFICE
CERTIFICATE OF CORRECTION

| | | |
|---|---|---|
| PATENT NO. | : 9,018,604 B2 | Page 1 of 1 |
| APPLICATION NO. | : 14/250709 | |
| DATED | : April 28, 2015 | |
| INVENTOR(S) | : Goto Niimi et al. | |

It is certified that error appears in the above-identified patent and that said Letters Patent is hereby corrected as shown below:

Title Page,
(72) Inventors should read: Gota Niimi, Shizuoka-ken (JP), Paulus P. M. Blom, Veldhoven (NL), Wilhelmus V. J. Van Nunspeet, Simpelveld (NL)

Signed and Sealed this
Twenty-sixth Day of January, 2016

Michelle K. Lee
*Director of the United States Patent and Trademark Office*